United States Patent [19]

Kurtz et al.

[11] Patent Number: 5,387,803
[45] Date of Patent: Feb. 7, 1995

[54] PIEZO-OPTICAL PRESSURE SENSITIVE SWITCH WITH POROUS MATERIAL

[75] Inventors: Anthony D. Kurtz, Teaneck, N.J.; Joseph S. Shor, Flushing, N.Y.; Alexander A. Ned, Bloomingdale, N.J.

[73] Assignee: Kulite Semiconductor Products, Inc., Leonia, N.J.

[21] Appl. No.: 78,392

[22] Filed: Jun. 16, 1993

[51] Int. Cl.$^6$ .............................. H01L 29/84
[52] U.S. Cl. ........................ 257/3; 257/415; 257/417; 257/418; 257/419; 73/517 R; 73/777
[58] Field of Search .................. 257/3, 415, 417, 418, 257/419, 420; 73/517 R, 777

[56] References Cited

U.S. PATENT DOCUMENTS

| | | | |
|---|---|---|---|
| 4,204,185 | 5/1980 | Kurtz et al. | 338/4 |
| 4,878,107 | 10/1989 | Hopper | 257/415 |
| 4,935,935 | 6/1990 | Reed et al. | 257/417 X |
| 5,272,355 | 12/1993 | Namauar et al. | 257/3 |

OTHER PUBLICATIONS

Suzuki et al., "A 1024-Element High-Performance Silicon Tactile Imager," *IEEE Transactions on Electron Devices*, vol. 17, No. 8, Aug. 1990, pp. 1852–1859.
Cavity Quantum Electrodynamics, Scientific American, Serge Haroche and Jean-Michel Raimond, Apr. 1993, pp. 54–62.
Piezoresistance and Quantum Confinement in Microcrystalline Silicon, Materials Research Society Symposium Proc., vol. 256, J. S. Foresi and T. D. Moustakas, pp. 77–82.

*Primary Examiner*—William Mintel
*Attorney, Agent, or Firm*—Arthur L. Plevy

[57] ABSTRACT

Piezo-optical pressure sensitive devices employing porous semiconductor material as a stress sensitive member. The devices monitor pressure or force applied thereto by detecting a corresponding change in the amount of light absorbed by a porous layer of semiconductive material such as silicon. A pressure or stress signal is thus converted into an optical one. The sensing element of an optical switch embodiment of the device is comprised of a transparent layer of material upon which there is disposed a porous layer of semiconductive material. When unstressed, the porous layer absorbs monochromatic light of a predetermined wavelength. When the porous layer is stressed, a metallized epitaxial layer formed thereon reflects the light back through the transparent layer where it can be detected by a light detection system.

17 Claims, 5 Drawing Sheets

PIEZO-OPTICAL PRESSURE SENSITIVE SWITCH WITH POROUS MATERIAL

BACKGROUND OF THE INVENTION

This invention relates to semiconductor devices in general and more particularly, to a pressure sensitive piezo-optical switch fabricated from a porous semiconductive material.

It has long been known that the application of a pressure or stress can affect not only the energy gap of semiconductors but also the population of the various equi energy valleys, thereby altering the quantity of energetic carriers. The sensitivity to stress exhibited by semiconductor materials has enabled the fabrication of a wide variety of devices including semiconductor diode microphones, transistor microphones, stress sensing tunnel diodes, and a whole class of piezoresistive transducers. See, for example, U.S. Pat. No. 4,204,185 entitled INTEGRAL TRANSDUCER ASSEMBLIES EMPLOYING THIN HOMOGENEOUS DIAPHRAGMS, issued to Anthony D, Kurtz and Richard A. Weber on May 20, 1980 and assigned to the assignee herein for an illustrative transducer device employing the piezoresistive effect.

Reference is made to an article by Serge Haroche and Jean-Michel Raimond entitled "Cavity Quantum Electrodynamics" and appearing in the Scientific American, April 1993. In that article, the authors describe a condition in which an excited atom is confined in a cavity so small that the atom is unable to radiate light because the wavelength of the oscillating field it would "like" to produce cannot fit within the boundaries. As long as the atom can not emit a photon, it remains at the same energy level. When so confined, the atom-cavity system apparently oscillates between two states, one consisting of an excited atom and no photon and the other of a de-excited atom and a photon trapped in the cavity.

Reference is also made to an article appearing in Vol. 256 of the Materials Research Society Symposium Proc. (1992), J. S. Foresi and T. D. Moustakas in which the phenomenon of quantum confinement in microcrystalline silicon and its effect on piezoresistance is examined. The authors of that article note that although the microstructure of microcrystalline silicon is similar to that of granular metals, the effect of strain on the conductivity of microcrystalline silicon is contrary to that which has been observed in such metals. Specifically, while the conductivity of granular metals increases with compressive strain as the metal grains are brought closer together and the tunneling distance through the insulating barriers surrounding the metal grains decreases, conductivity decreases of up to 100 percent were observed in microcrystalline silicon films under compression, suggesting that such films might be utilized for highly sensitive strain gauge applications. Foresi et al. attributed the decreases in conductivity to quantum confinement of the energetic carriers in the small silicon crystallites and to the change of the ground state energy in the quantum wells with strain.

It has also been observed that in certain instances, porous silicon exhibits unique properties which are superior to those of bulk silicon. For example, it has been found by light transmission measurements that the band gap in microporous silicon is increased by 0.5 eV over that of bulk silicon. One explanation which has been advanced for the increase in band gap energy is that the energetic carriers are confined in quantum sized wells defined by the microporous structure.

The semiconductive properties of SiC have also been the subject of recent attention. Its wide band-gap, high thermal conductivity, high breakdown electric field, and high melting point make SiC an excellent material for high temperature and high power applications. In U.S. patent application Ser. No. 07/957,519 now U.S. Pat. No. 5,298,767 entitled Porous Silicon Carbide (SiC) Semiconductor Device issued on Mar. 29, 1994, the present applicants disclose methods of forming a new semiconductor material, porous SiC by electrochemical anodization of monocrystalline SiC. It is expected that the microporous structure of porous silicon carbide exhibits the same capacity for quantum confinement as that of porous silicon.

It is therefore an object of the present invention to advantageously utilize porous semiconductor materials, such as silicon and silicon carbide, in the fabrication of improved piezo-optical pressure sensitive switch devices.

SUMMARY OF THE INVENTION

A pressure sensitive optical device fabricated in accordance with the present invention employs a porous semiconductive material as a stress sensitive member. The device monitors pressure or force applied thereto by detecting a corresponding change in the frequency of light absorbed by the porous layer. A pressure or stress signal is thus converted into an optical one. Porous material is used as the absorptive material because of the stress enhancement possible in structures comprised of such material. This stress enhancement gives rise to larger changes in optical absorption as compared to non-porous semiconductors.

The sensing element of an optical switch embodiment of the device is comprised of a transparent layer of material upon which there is disposed a porous layer of semiconductive material. When unstressed, the porous layer absorbs monochromatic light of a predetermined wavelength. When the porous layer is stressed, the energy gap is changed and light of a particular wavelength may no longer be absorbed. The porous material has an overcoat of non-porous material such that when a pressure or force is applied to the non-porous portion, a much higher internal stress will result in the porous material because of stress multiplication. Thus, the internal crystallites will be under a much higher stress than the non-porous cover. This high internal stress can change the effective energy gap by: 1) the normal change of energy gap with pressure or stress and 2) by causing a re-distribution of the population of "heavy" and "light" carriers, thus effecting the "quantum confinement". In both cases, because of internal stress multiplication, these effects are larger than in non-porous semiconductors subject to the same external stress.

DETAILED DESCRIPTION OF THE INVENTION

Figure 1A:
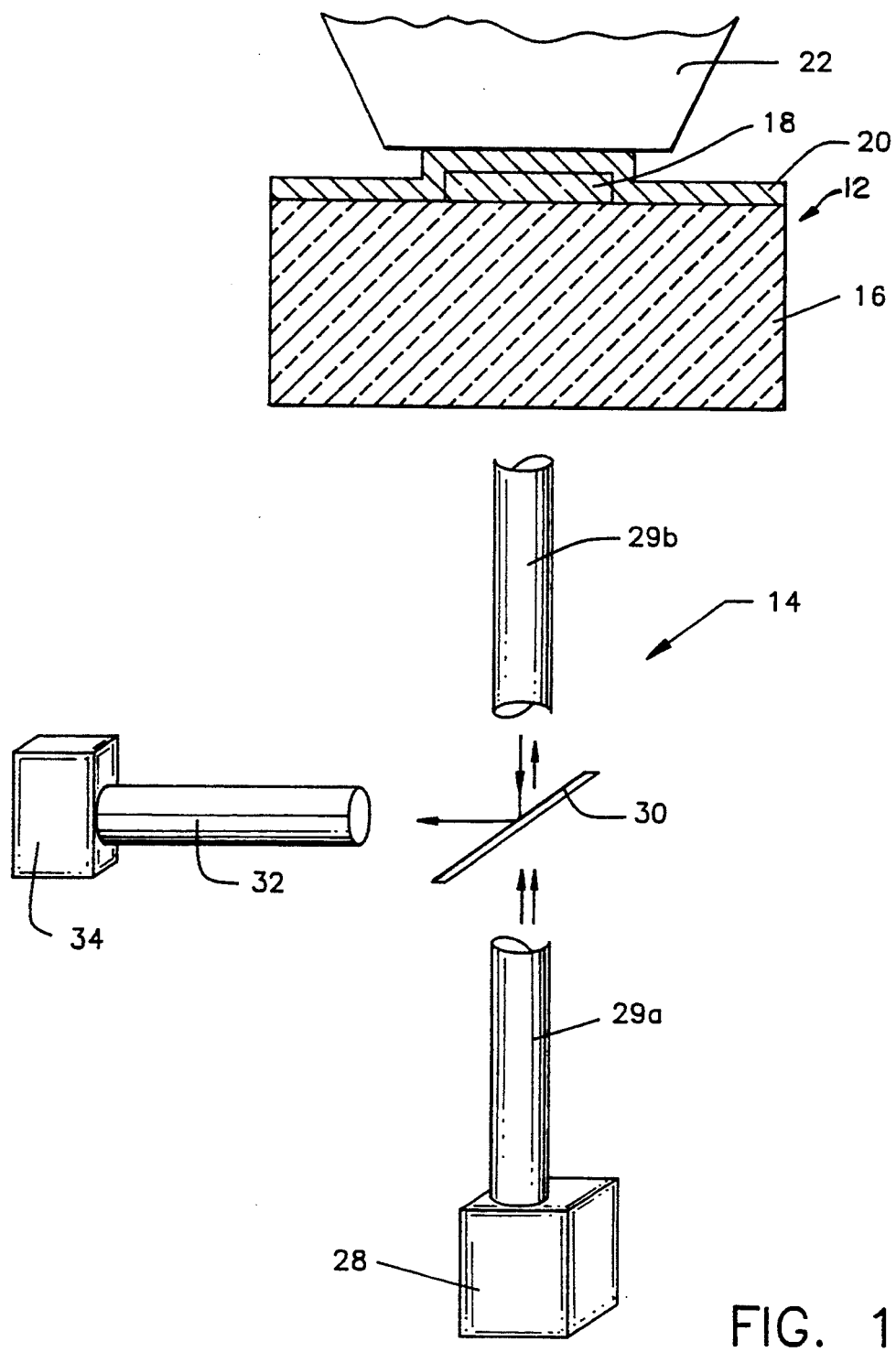
FIG. 1A is a cross sectional view of a substrate of semiconductor material utilized to produce a stress sensitive device in accordance with one embodiment of the present invention.

With reference to FIG. 1A, there can be seen an illustrative embodiment of a stress sensitive piezo-optical switch device 10 constructed in accordance with the present invention. As seen in FIG. 1A, the switch device 10 of the illustrative embodiment includes a sensing element 12 and a light source and detector system 14. The sensing element 12 is comprised of a layer or substrate 16 of substantially transparent material capable of transmitting therethrough the wavelength of light being used in the sensing system. Disposed on a surface of transparent material 16 is a layer 18 of microporous semiconductive material, which is preferably monocrystalline. The porous layer 18 may be comprised of silicon, silicon carbide, or any other porous semiconductive material which undergoes a proportional change in light absorption in response to the application of a pressure, stress, or other force thereto. This characteristic change in light absorption, which may be of a predetermined wavelength, is measured by light source and detecting system 14, in a manner which will be described later.

With continuing reference to FIG. 1A, it can be seen that there is a cap layer 20 disposed on porous layer 18. Pressure or stress forces applied to cap layer 20 are transmitted through the cap layer and thus into porous layer 18. For a reason which will soon become apparent, cap layer 20 is preferably covered by a thin layer (not shown) of metal, metal alloy, or some other material capable of defining a reflective surface. The purpose of the thin reflective layer is to transmit the light back through the porous layer and the substrate so that it can be detected by the light detection system 14. The cap layer 20 provides a mirror finish for the metal layer and also enhances the mechanical stability of the sensing element 12.

Figure 1B:
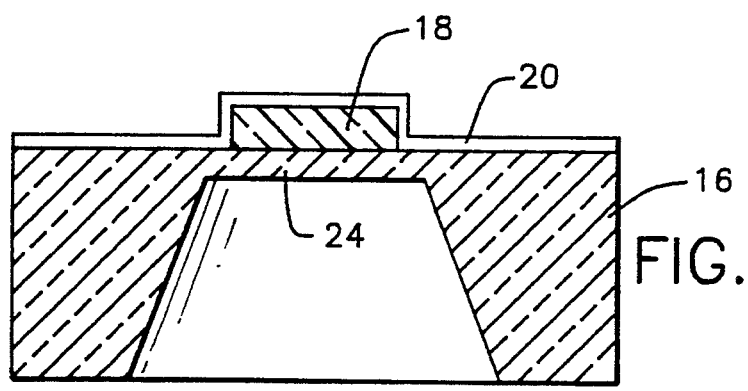
FIG. 1B is a cross sectional view of an alternate embodiment of a stress sensitive device constructed in accordance with the present invention.

The sensing element 12 of the illustrative embodiment may be utilized to measure relatively high pressures (i.e. above 10,000 psi) applied directly to cap layer 20. In the illustrative embodiment depicted in FIG. 1A, however, the piezo-optical device 10 utilizes an optional force concentrator 22. Force concentrator 22 may, for example, utilize a large area pressure-force collector to develop a sufficient force to be sensed by the sensing element 12. In the alternate embodiment depicted in FIG. 1b, no force concentrator is needed. Instead, a diaphragm 24 is defined in the bottom surface of the transparent substrate 16, whereby deflection of the diaphragm caused by the application of strains or other forces changes the optical absorption coefficient of the porous layer in a manner which is measurable by light detection device 14. It will be observed that the porous configuration of the layer 18, in which the interpore spacing is on the order of 5-100 nm and preferably less than 100 angstroms, the stress applied to the cap layer is concentrated at the crystalline regions extending therethrough. As such, regardless of the specific embodiment employed, a greater degree of sensitivity to stress and pressure forces will be possible in comparison to prior art devices.

The construction and operation of the light source and selection system 14 will now be described. It will, of course, be understood that the embodiment herein set forth, which makes use of a fiber optic cable system, is for example purposes only, and that it is contemplated that a wide variety of techniques of transmitting and directing light between supply and detection elements may be utilized in accordance with the present invention. With continuing reference to FIG. 1A, there is shown a fiber optic light transmission system in which light of a predetermined wavelength supplied from a suitable light source 28 is transmitted through the first section of a fiber optic cable 29a. As will be explained later, the selected frequency will be selected so that energy of the photons in the light match the energy of the energy gap of the porous layer 18. The light passes through a two way mirror element 30 and then passes through a second section of fiber optic cable 29b. Light leaving cable section 29b is incident on the surface 26 of porous layer 18 and is reflected by the reflective layer formed on the surface of cap layer 20. The reflected light is then received and transmitted back through the fiber optic cable section 29b but is reflected by two way mirror element 30 into a third fiber optic cable section 32, whereupon the light is received by a detection means 34 which is adapted to determine whether the light has been reflected or absorbed by the sensing element as well as the degree to which it has been absorbed. The degree to which the light is absorbed is utilized to determine the amount of stress or force applied to the porous layer. Devices for measuring the intensity of light are well known in the art and a description of the same has therefore been omitted.

The illustrative device 10 shown in FIG. 1A can be operated as a piezo-optical switch by matching the energy level of the light to that of the energy gap of the porous layer, as indicated above. By way of example, with monochromatic light of a frequency attuned to the unstressed energy gap of the porous layer 18, the device can be switched from a transmitting state to a non-transmitting state by applying stress to the non-porous cap layer 20. This change in state occurs because light of a lower energy than that of the energy gap will not be absorbed. As such, when a stress is applied, the energy gap increases until light is no longer absorbed by porous layer 18. Accordingly, the light incident thereon is reflected by mirror element 30 and thereafter detected by photodetection means 34.

Figure 2A:
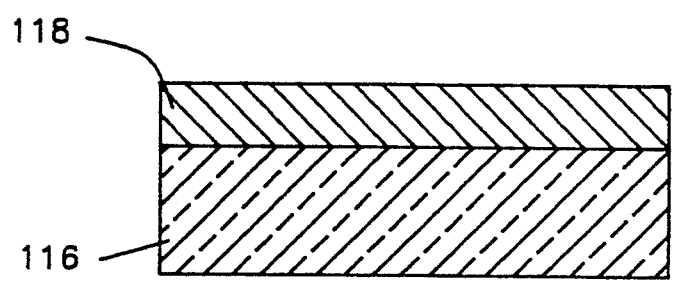
FIGS. 2a–2d illustrate various steps of forming a sensing element in accordance with one embodiment of the present invention.
Figure 2B:
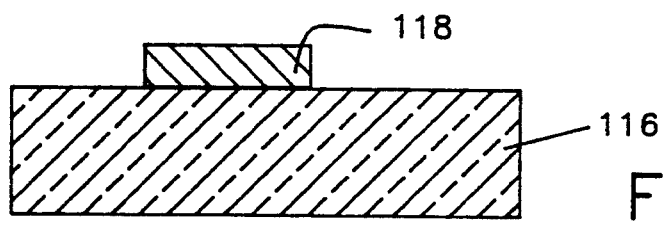

Several techniques for fabricating a piezo-optical sensor/switch element in accordance with the present invention will now be described. With reference now to FIGS. 2a-2d, a first technique for fabricating a sensor element 112 will be explained. As indicated previously, the sensing element comprises a layer or substrate 116 of substantially transparent crystalline material which is capable of transmitting therethrough the wavelength of light being used in the sensing system. In the embodiment depicted in FIG. 2a, the substrate is a sapphire ($Al_2O_3$) wafer having a thickness which may be on the order of 0.003 to 0.015 inches thick. It will, of course, be understood that any transparent crystalline material, such as borosilicate glass or silicon dioxide may be utilized. Disposed on the surface of transparent layer 116 is a layer 118 of semiconductive material. The thickness of the semiconductive layer may be on the order of 4-50 $\mu$m, although the particular thickness will vary in accordance with the particular response to stress desired and the specific semiconductive material selected. In the illustrative embodiment of FIG. 2a, the layer 118 is monocrystalline silicon, the silicon being doped with an n- or p-type conductivity. The silicon layer 118 may be etched photolithographically as shown in FIG. 2b.

The silicon layer 118 is processed to form porous silicon. It will, of course, be appreciated that the aforementioned step of etching silicon layer 118 may be performed after it has been made porous. There is extensive literature in the prior art relating to the formation of microporous silicon, and for this reason a detailed description of such processes has been omitted. Reference may, for example, be had to an article by R. L. Smith and S. D. Collins appearing in the Journal of Applied Physics, Volume 8, R1 (1992). In that reference, there is disclosed a porous silicon formation process utilizing electrochemical anodization. As set forth in the aforementioned Smith reference, the conductivity type of the silicon determines the specific anodization conditions in that n-type silicon is anodized in the presence of light while p-type silicon is anodized under dark conditions.

Where it is desired to utilize silicon carbide as the porous layer material, reference may also be had to U.S. patent application Ser. No. 07/957,5 19 entitled POROUS SILICON CARBIDE RELATED METHODS AND APPARATUS now U.S. Pat. No. 5,298,767 issued on Mar. 29, 1994 and assigned to the assignee herein. In the aforementioned patent application, the disclosure of which is incorporated herein by reference, several techniques for forming porous silicon carbide are described.

Figure 2C:
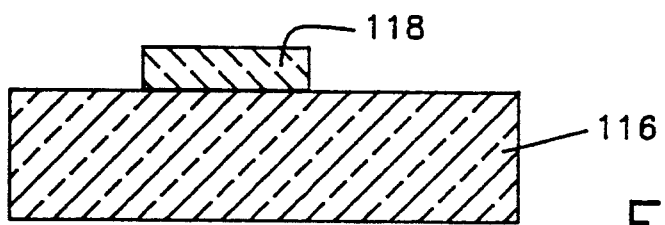

The underlying sapphire material is unaffected by the electrochemical anodization process, thus resulting in the structure depicted in FIG. 2c. A thin cap layer 120, which is preferably comprised of the same semiconductive material as the porous layer 118, is then formed thereon by any appropriate technique. The cap layer 120 may, for example, be epitaxially grown on porous layer 118. To prevent the cap layer 120 from absorbing a significant portion of the fight and thus affecting the accuracy of the system, it is preferably grown to a depth of between 1000 angstroms to 1 micron. The precise thickness, however, may be varied in accordance with the optical properties of the specific semiconductive material utilized. In order to reflect the light transmitted through layer 116 and thin cap layer 120, a layer of reflective material is deposited on the cap layers. Any reflective material having the desired reflective properties may be used. By way of example, a layer of platinum 122 may be deposited on the epilayer, resulting in the metallized layer depicted in FIG. 2d. Alternatively, if the etching step of layer 118 is deferred until after the electrochemical anodization process, the porous layer 118 and cap layer 120 may be patterned and etched photolithographically just prior to the deposition of the reflective layer 122. The sensing elements illustrated in FIG. 2d may, for example, be utilized to sense direct overhead pressure, or they may used in conjunction with a stress concentrator, as illustrated in FIG. 1.

Another embodiment of a sensing element which may be constructed in accordance with the present invention will now be described with reference to FIGS. 3a-3e. Although the embodiment illustrated in FIGS. 3a-3e depicts the formation of a diaphragm structure, it will be appreciated that the technique to be described is equally applicable to the fabrication of sensing elements without a diaphragm, such as the one illustrated in FIG. 1.

Figure 3A:
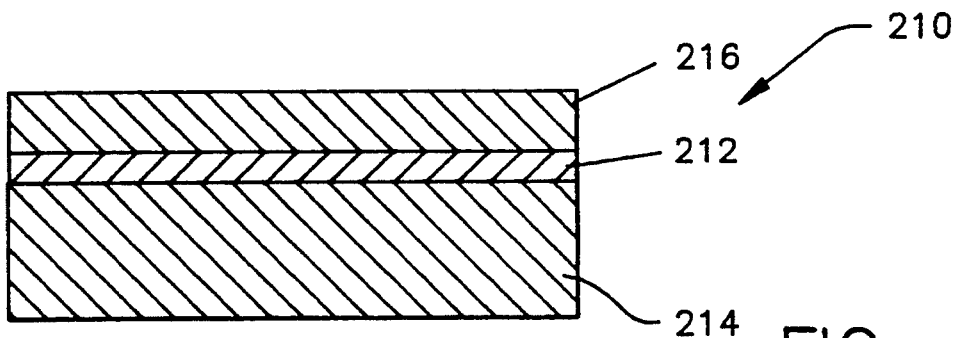
FIGS. 3a-3e are a series of cross sectional illustrations depicting various steps of forming a sensing element in accordance with another embodiment of the present invention.
Figure 3B:
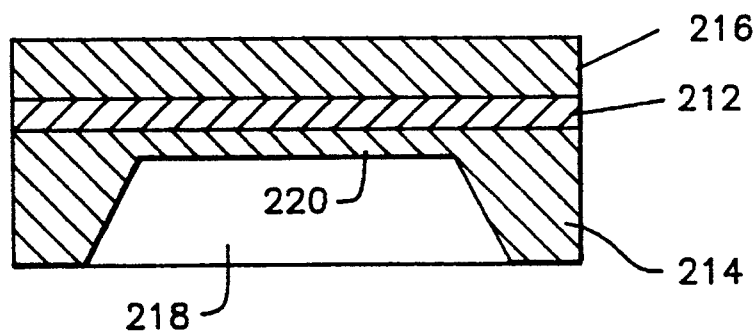

With reference now to FIG. 3a, there is shown a multi-layer wafer 210 of a semiconductive material such as silicon or silicon carbide. The multilayer wafer of the illustrative embodiment comprises an n-type layer 212 sandwiched between two n+ layers 214 and 216. It should, however, be understood that the conductivity types of the respective wafer layers may be modified without departing from the scope of the present invention, and that the illustrative arrangement is selected for exemplary purposes only. Specifically, the conductivity of the central layer is selected to act as an etch-stop when etching the two outer layers with a conductivity selective etch such as hydazine. Electrochemical etch stops between different conductivity types are well known in the prior art. See, for example, U.S. Pat. No. 5,165,283 entitled HIGH TEMPERATURE TRANSDUCERS AND METHODS OF FABRICATING THE SAME EMPLOYING SILICON CARBIDE issued to Anthony D. Kurtz et al on Nov. 24, 1993 and assigned to the assignee herein. In that patent, the disclosure of which is incorporated herein by reference, there is a discussion of the use of etch stops in silicon carbide. It will thus be readily apparent that the present invention contemplates other arrangements of layers which include, but are not limited to the following combinations: p/n/p,n+/n/p, p+/p/p+,n/p/n, and n/p/p+.

The respective layers of wafer 210 may be obtained utilizing any conventional procedure. By way of example, wafer 210 can be formed by epitaxially growing a silicon etch stop layer 212, which may have a thickness on the order of 0.5 to 1.0 $\mu$m, on the surface of an n+ silicon wafer 214, which wafer may have a thickness on the order of 3 to 15 mils. Layer 212 is then doped n-type using a conventional diffusion or ion implantation process. Such techniques are well known in the art. A second silicon layer 216, which may be on the order of 4–50 $\mu$m, is then grown over layer 212 and doped n+, thereby resulting in the structure depicted in FIG. 3a.

As indicated earlier, forming a thin diaphragm in the sensing element can substantially enhance the sensitivity thereof, and may thus obviate the need for an external force concentrator. For example purposes, the embodiment depicted in FIGS. 3b-3e incorporates such a diaphragm structure, which structure is formed by etching an aperture 218 in layer 214. The diaphragm 220 is preferably between 2–40 $\mu$m thick. It will, of course, be appreciated by those skilled in the art that the use of a diaphragm structure is not required and that it is contemplated that such structure may be omitted depending upon the application and the sensitivity to stress desired.

Layer 214 of the multilayer wafer 210 is now electrochemically photoanodized in accordance with a suitable technique such as that set forth in the aforementioned U.S. patent application Ser. No. 07/957,519 now U.S. Pat. No. 5,298,767. For a purpose which will be described later, layer 216 is preferably covered with black wax or some other suitable encapsulant prior to the anodization process in order to prevent the same from becoming porous. As will be readily appreciated by those of ordinary skill in the art, the anodization takes place in a conductivity selective etchant solution which will attack the n+ layer 214 but not the n layer 212. As previously indicated, the purpose of the n layer 212 is to act as an etch stop, thereby protecting the encapsulated n+ layer 216 from the anodization process.

Figure 3C:
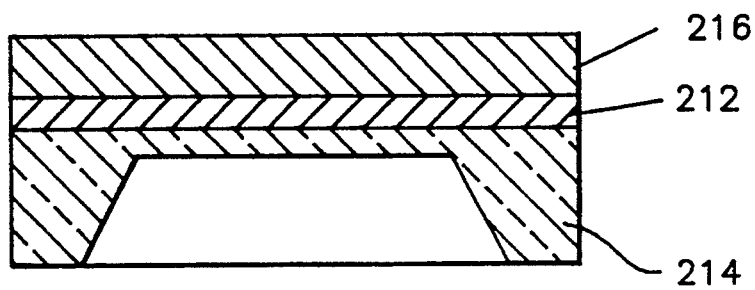

Once the wafer 210 has been photoanodized to render layer 214 porous, it is subjected to a thermal oxidization process. During the oxidation process the porous layer of silicon is converted to silicon dioxide. Processes which convert porous silicon to silicon dioxide are well known in the art. One such process is described in an article by C. Oules et al appearing in the Journal of the Electrochemical Society, Volume 139, No. 12 (1992). As disclosed in the Oules et al article, the oxidized layer 214 of porous silicon can be densified by heating it in an oxygen ambient, thereby resulting in a continuous (i.e. non-porous) layer of silicon dioxide as shown in FIG. 3c.

Figure 3D:
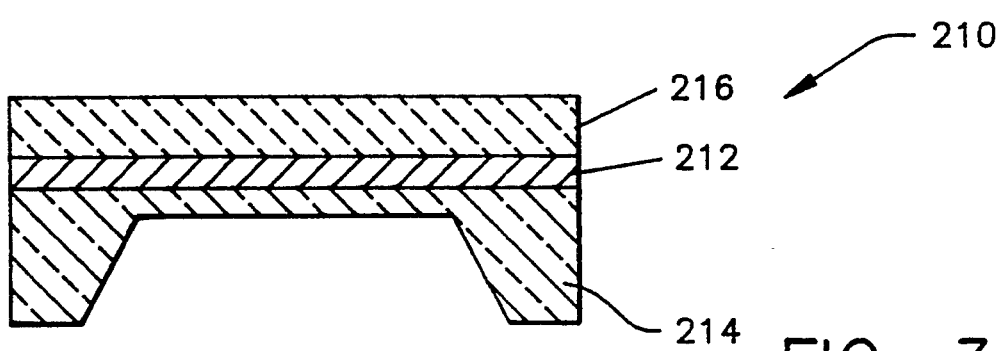
Figure 3E:
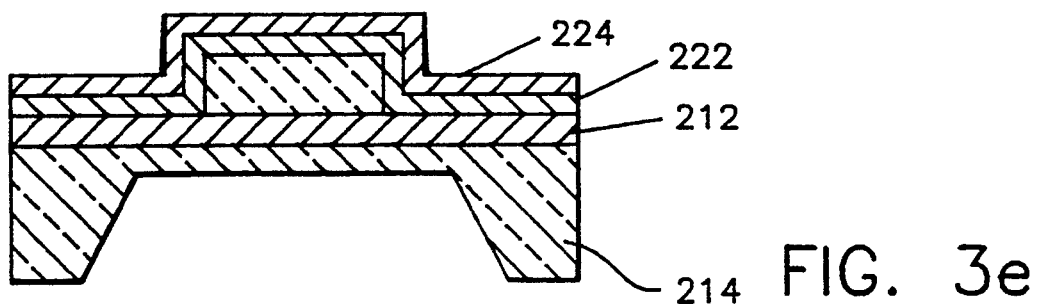

Subsequently, the silicon dioxide layer 214 is covered with a suitable encapsulant and the electrochemical photoanodization process described above is repeated for the top layer 216. As before, n-layer 212 acts as an etch stop so that only the top n+ layer becomes porous. The resulting structure is depicted in FIG. 3d. As described in the Oules reference, an epitaxial cap layer 222 of silicon is grown on the surface of the porous layer 216, and a layer 224 of metal or other suitable reflective material is then deposited thereon, thereby resulting in the structure depicted in FIG. 3e. It will again be emphasized that the thickness of the cap layer should be selected in accordance with the optical characteristics of the specific semiconductive material utilized so that it does not absorb an appreciable amount of the light transmitted into the sensing element. The maximum thickness of the epilayer is, in fact, dictated by the absorption depth of the light in that material.

Figure 2D:
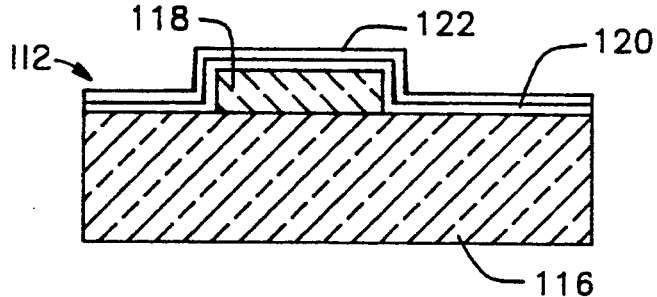

The embodiments of the sensing element of the present invention which lack a diaphragm structure, such as those depicted in FIGS. 2d and 2e, rely entirely upon the cap layer to push on the porous layer. Stress concentration inherently takes place in the porous layer because of its reduced density. In fact, the porous layer may be analogized to a network of springs which are compressed by the cap layer when a stress is applied thereto. As previously indicated, a stress concentrator may be desirable if the sensing element is not to be utilized in a high pressure environment. Accordingly, the fabrication of a modified sensing element which includes a stress concentrator will now be described with reference to FIGS. 4a–4d.

One technique which may be employed to construct a stress concentrator for use in a sensing element fabricated in accordance with the present invention is described in U.S. patent application 08/058,016, entitled SEMICONDUCTOR STRUCTURES HAVING ENVIRONMENTALLY ISOLATED ELEMENTS AND METHOD FOR MAKING THE SAME, filed on May 7, 1993 and assigned to the assignee herein. In the aforementioned application, the disclosure of which is incorporated herein by reference, there is described a technique for fabricating a cover wafer from a wafer of semiconductive material such as silicon in which trenches are etched on a surface thereof to define contact projections and a projecting rim portion which are bonded to the surface of a wafer having semiconductor elements thereon to hermetically seal and isolate the semiconductor elements from the external environment. In accordance with the technique to be described herein, such a cover wafer may also be bonded to a sensing element fabricated in accordance with the present invention so as to serve as a stress concentrator.

Figure 4A:
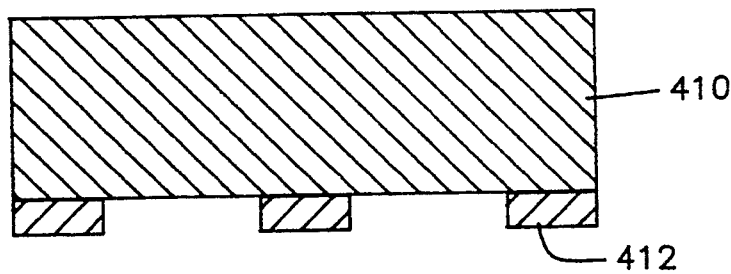
FIGS. 4a-4d are a series of illustrations depicting the formation of a modified sensing element in accordance with yet another embodiment of the present invention.
Figure 4B:
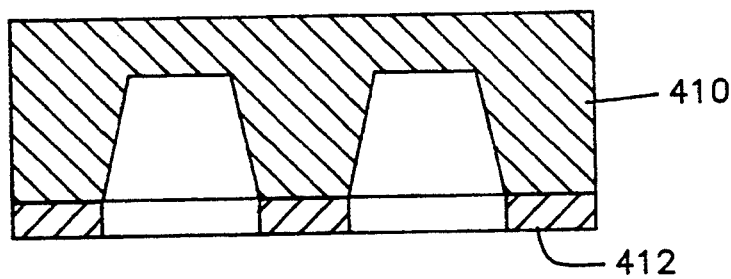
Figure 4C:
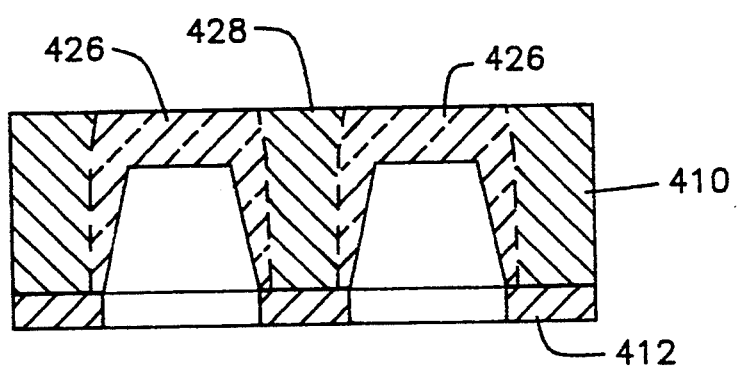

With particular reference to FIG. 4a, there is shown a wafer 410 which is preferably comprised of the same semiconductive material as the sensing element and from which a stress concentrating element will be formed. In the illustrative embodiment, wafer 410 is comprised of silicon which has been doped p+ using boron or some other impurity suitable for this purpose. The wafer is covered with a layer of silicon nitride 412 which is patterned photolithographically, as shown. The exposed areas of silicon are subsequently etched using an etchant which will not attack the silicon nitride, such as KOH, so that the wafer is thinned to a thickness which is preferably between 10 and 40 μm. The resulting structure is shown in FIG. 4b. The wafer 410 is then electrochemically anodized from the side having the silicon nitride thereon, resulting in the formation of a porous region 426 that surrounds a central, non-porous support region 428. This results in the structure illustrated in FIG. cu. Wafer 410 is subsequently oxidized and densified to convert porous region 426 into amorphous, continuous silicon dioxide, and the patterned layer of silicon nitride 412 is then removed by a suitable etchant, such as phosphoric acid, which will not attack the rod-like silicon region 428 or the silicon dioxide region 426.

Figure 4D:
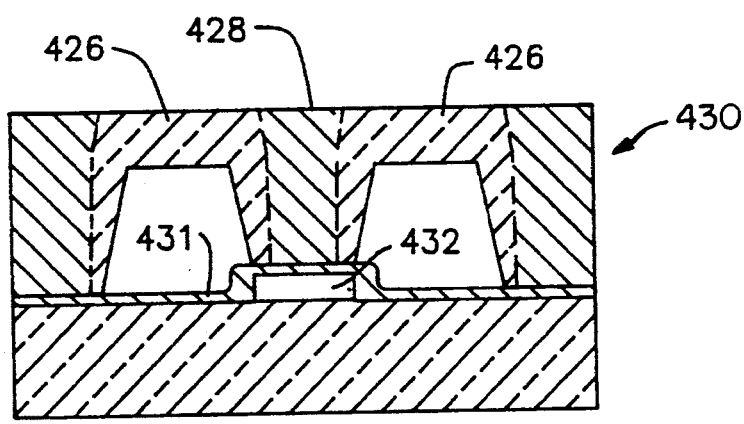

As best shown in FIG. 4d, wafer embodying the resulting stress concentrating element is then contacted with a wafer embodying a sensing element 430, which sensing element may be fabricated in accordance with any one of the techniques described hereinbefore. It will be observed that the surface of the rod shaped silicon region 428 is aligned with and contacts the surface of reflective layer 431 directly over porous region 432 of sensing element 430. The contacted wafers are then bonded using a conventional bonding technique. Because techniques for bonding wafers together are well known in the art, a detailed description of the same has been omitted. Reference may, for example, be had to U.S. patent application Ser. No. 08/058,400, filed on May 7, 1993 and entitled FUSION BONDING TECHNIQUE FOR USE IN FABRICATING SEMICONDUCTOR DEVICES, now U.S. Pat. No. 5,286,671 issued on Feb. 15, 1994 which is assigned to the assignee herein for one technique which may be utilized to bond the aforementioned elements.

Because of the low modulus of elasticity of silicon dioxide, the region 426 will deflect when a pressure or other force is applied to the stress concentrating element 410, thereby causing the rod-shaped central p+ silicon region 428 to exert a concentrated stress force on the sensing element 430. It will be readily appreciated by those of ordinary skill in the art that the amount of additional stress concentration in the stress concentrating element will depend upon the ratio between the deflecting area defined by the deflecting region 426 and the porous portion 432 of the sensing element. Preferably, the surface area of the rod-shaped central region 428 is larger than the porous portion 432 it covers in order to ensure complete coverage thereof.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A stress sensitive semiconductor device comprising:

a body of substantially transparent material;

a porous region of a semiconductive material disposed on said body, said porous region having a given conductivity and being adapted to undergo a change in light absorption proportional to a stress applied thereto; and reflective means for reflecting light transmitted through said body and said porous region.

2. The device according to claim 1, wherein said body of substantially transparent material is selected from a class consisting of silicon dioxide, corundum, and borosilicate glass.

3. The device according to claim 2, wherein a thickness of said body of substantially transparent material is between 0.003 and 0.015 inches.

4. The device according to claim 1, wherein said semiconductive material is monocrystalline.

5. The device according to claim 4, wherein said semiconductive material is silicon.

6. The device according to claim 4, wherein said semiconductive material is silicon carbide.

7. The device according to claim 1, wherein a thickness of said porous region is 4 to 50 microns.

8. The device according to claim 1, wherein dimensions of the pores in said porous region are selected to obtain full absorption of monochromatic light of a predetermined wavelength when said porous region is in an unstressed condition.

9. The device according to claim 8, wherein an average diameter of said pores is between 5 and 150 nm.

10. The device according to claim 1, wherein an average interpose spacing is between 5 and 100 nm.

11. The device according to claim 10, wherein an average interpose spacing is less than 10 nm.

12. The device according to claim 1, wherein said reflective means comprises a metallized epitaxial layer of said semiconductive material disposed on a surface of said porous region.

13. The device according to claim 1, further comprising stress concentration means for applying a concentrated stress to said porous region.

14. The device according to claim 13, wherein said stress concentration means comprises a substrate structure of deflecting material, said structure defining a rod shaped region of non-deflecting material which extends therethrough and which is supported by said porous region.

15. The device according to claim 1, further comprising a layer of said semiconductive material interposed between said porous region and said body of substantially transparent material, said layer having a different dopant concentration than said porous region.

16. A piezo-optical pressure sensing device comprising a body of substantially transparent material;

a porous region of a semiconductive material having pores disposed on said body, said porous region having a given conductivity and being adapted to undergo a change in light absorption proportional to a stress applied thereto;

reflective means for reflecting light transmitted through said body and said porous region; and light source means for transmitting light of a predetermined wavelength through said body of transparent material and said porous region; and light detection means for detecting an amount of light reflected by said reflective means, wherein absorption of a predetermined wavelength which is not absorbed by said porous region is detected and measured by said light detection means.

17. The piezo-optical pressure sensing device according to claim 16, wherein dimensions of said pores in said porous region are selected to obtain full absorption of the light of said predetermined wavelength when said porous region is in an unstressed condition.

* * * * *